United States Patent
Xu et al.

(10) Patent No.: US 10,192,776 B1
(45) Date of Patent: Jan. 29, 2019

(54) MANUFACTURING METHOD OF A FLASH WAFER

(71) Applicant: SHANGHAI HUALI MICROELECTRONICS CORPORATION, Shanghai (CN)

(72) Inventors: Pengkai Xu, Shanghai (CN); Fulong Qiao, Shanghai (CN); Yi Wang, Shanghai (CN)

(73) Assignee: SHANGHAI HUALI MICROELECTRONICS CORPORATION, Shanghai (CN)

( * ) Notice: Subject to any disclaimer, the term of this patent is extended or adjusted under 35 U.S.C. 154(b) by 0 days.

(21) Appl. No.: 15/822,226

(22) Filed: Nov. 27, 2017

(30) Foreign Application Priority Data

Oct. 23, 2017 (CN) .......................... 2017 1 1057785

(51) Int. Cl.
*H01L 21/76* (2006.01)
*H01L 21/762* (2006.01)
*H01L 27/11548* (2017.01)

(52) U.S. Cl.
CPC .. *H01L 21/76224* (2013.01); *H01L 27/11548* (2013.01)

(58) Field of Classification Search
CPC ..................... H01L 21/76224; H01L 27/11548
USPC .......................................................... 438/424
See application file for complete search history.

(56) References Cited

U.S. PATENT DOCUMENTS

| | | | |
|---|---|---|---|
| 9,048,130 B2 * | 6/2015 | Yamazaki | H01L 27/0688 |
| 9,679,909 B2 * | 6/2017 | Chuang | H01L 27/11575 |
| 2016/0181261 A1 * | 6/2016 | Wu | H01L 27/11521 |
| | | | 257/316 |

* cited by examiner

*Primary Examiner* — Vu A Vu
(74) *Attorney, Agent, or Firm* — Tianchen LLC

(57) ABSTRACT

A manufacturing method of a Flash wafer, comprises: fabricating a Flash wafer containing a cell area, a logical area and a capacitance area; adjusting the height of the silicon oxide filled shallow trench in the logical area and the capacitance area; sequentially depositing a silicon nitride layer and a silicon oxide layer on the upper surface of the Flash wafer, and sequentially removing the silicon oxide layer and the silicon nitride layer on the upper surface of the cell area and on the upper surface of the floating gate in the logical area and the capacitance area; adjusting the height of the silicon oxide filled shallow trench in the cell area and the capacitance area; depositing an interlayer dielectric layer on the surface of the Flash wafer; removing the rest part in the logical area by protecting the cell area and the capacitance area with a mask.

9 Claims, 4 Drawing Sheets

--the prior art--

--the prior art--

MANUFACTURING METHOD OF A FLASH WAFER

CROSS-REFERENCE TO RELAYED APPLICATION

This application claims the priority benefit of China application serial no. 201711057785.6, filed Oct. 23, 2017. All disclosure of the China application is incorporated herein by reference.

FIELD OF THE INVENTION

The present invention relates to the field of semiconductor manufacturing, and more particularly to a manufacturing method of a Flash wafer.

BACKGROUND OF THE INVENTION

For flash memory devices by using a single floating gate to store an electric charge, which represents data, a capacitance area (CAP) is generally added into the flash memory devices which has a cell area and a logical area. The film layer depositing on the newly added capacitance area is the same as the film layer of the control gate in the cell area, and there is a floating gate both above the active areas in the capacitance area and the cell area, and the material of the floating gate is polysilicon.

However, there is no a floating gate on the shallow trench isolation (STI) of the capacitance area, and the width of the STI in the capacitance area is larger than the width of the STI in the cell area. Thus, unlike in the cell area, the subsequent processes can't make the total thickness of the polysilicon layer on the STI in the capacitance area equal to the total thickness of the polysilicon layer on the active area by controlling the growth of the polysilicon.

Wherein, the total thickness of the polysilicon layer on the active area of the capacitance area is a sum of the thicknesses of the floating gate and the polysilicon growing on the floating gate, but the total thickness of the polysilicon layer above the STI is relatively small due to no floating gate. Such difference in the thickness becomes more distinct in the growth of the subsequent film layer, as shown in FIG. 1. Such height difference makes the process window subsequent for controlling the etching procedure of the gate become narrow, even disappear.

It can be seen from FIG. 1 that, the above thickness difference is the height difference between the floating gate and a silicon oxide filled shallow trench in the Flash wafer, wherein the silicon oxide filled shallow trench is in the STI.

To reduce the height difference, the height of the silicon oxide filled shallow trench in the capacitance area may be increased so as to make it identical to the height of the floating gate as far as possible. In the prior art, the following processes are adopted to adjust the height of the silicon oxide filled shallow trench in the capacitance area, and the processes are specifically shown in FIG. 2:

(1) As shown in FIG. 2A, after a STI in the cell area is finished, a STI etching of the logical area and the capacitance area are performed by using a mask Z1 and thus a Flash wafer containing the cell area, the logical area and the capacitance area is obtained. Each of the cell area, the logical area and the capacitance area includes a STI and an active area, and the STI is in a gap of the active area; a floating gate is located above the active area and the material of the floating gate is polysilicon; and the upper surface of the Flash wafer is planarized to obtain a flat silicon oxide filled shallow trench.

(2) As shown in FIGS. 2B and 2C, by protecting the logical area with a mask Z2, the silicon oxide filled shallow trench in the cell area and the capacitance area is etched with negative photoresist, so that in the cell area and the capacitance area, the silicon oxide filled shallow trench is lower than the height of the floating gate above the active area. The function adjustment of the cell area can be achieved by adjusting such height difference.

(3) As shown in FIG. 2D, an interlayer dielectric layer consisting of silicon oxide-silicon nitride-silicon oxide layers is filled on the upper surface of the above Flash wafer.

(4) As shown in FIG. 2E, the interlayer dielectric layer, the floating gate and a part of silicon oxide filled shallow trench in the logical area are removed by protecting the cell area and the capacitance area with a mask Z3, to obtain the Flash wafer in which the height of the silicon oxide filled shallow trench is lower than the floating gate in the cell area and the capacitance area.

In the above manufacturing procedure, the silicon oxide filled shallow trench in the cell area and the capacitance area are synchronously changed in height due to the restriction of the mask in the existing process. When the height of the silicon oxide filled shallow trench in the capacitance area is increased relative to the height of the floating gate, the height of the silicon oxide filled shallow trench in the cell area will be also increased relative to the height of the floating gate. However, such change in the cell area will weaken the coupling rate between the control gate and the floating gate, thereby influence the storing property.

SUMMARY OF THE INVENTION

The present invention is directed to provide a new manufacturing method of a Flash wafer, which can achieve the adjustment on the height of the silicon oxide filled shallow trench in the capacitance area without adding new mask and changing the silicon oxide filled shallow trench in the cell area and the logical area.

To achieve the above objects, the present invention proposes the following technical solution: a manufacturing method of a Flash wafer, comprising the following steps of:

S01: fabricating a Flash wafer containing a cell area, a logical area and a capacitance area (cap), and performing a planarization to the upper surface of the Flash wafer, wherein each of the cell area, the logical area and the capacitance area includes a STI and an active area, the STI is located in a gap of the active area, there is a floating gate above the active area, a silicon oxide filled shallow trench is contained in the STI, and the upper surfaces of the planarized silicon oxide filled shallow trench and the floating gate are located on the same plane;

S02: adjusting the height of the silicon oxide filled shallow trench in the logical area and the capacitance area by protecting the cell area with a mask Z1, so that the silicon oxide filled shallow trench in the logical area and the capacitance area is lower than the floating gate after adjusting;

S03: sequentially depositing a silicon nitride layer and a silicon oxide layer on the upper surface of the Flash wafer, and sequentially removing the silicon oxide layer and the silicon nitride layer on the upper surface of the cell area and on the upper surface of the floating gate in the logical area and the capacitance area;

S04: adjusting the height of the silicon oxide filled shallow trench in the cell area and the capacitance area by protecting the logical area with a mask Z2. Since there is the silicon nitride on upper portion of the STI area in the capacitance area to act the protection function, the height of the silicon oxide filled shallow trench in the capacitance area is larger than that of the silicon oxide filled shallow trench in the cell area after adjusting;

S05: depositing an interlayer dielectric layer on the surface of the Flash wafer;

S06: removing the interlayer dielectric layer, the silicon oxide, the silicon nitride, the floating gate and a part of the silicon oxide filled shallow trench in the logical area by protecting the cell area and the capacitance area with a mask Z3, to obtain the cell area, the logical area and the capacitance area which are different in the height of the silicon oxide filled shallow trench.

Further, in the step S02, the method of adjusting the height of the silicon oxide filled shallow trench in the logical area and the capacitance area is to etch the silicon oxide filled shallow trench in the logical area and the capacitance area by using positive photoresist.

Further, the silicon oxide filled shallow trench in the logical area and the capacitance area after being etched by using the positive photoresist is lower than the floating gate by 100 Angstrom.

Further, in the step S03, the step of removing the silicon oxide layer and the silicon nitride layer on the upper surface of the cell area and on the upper surface of the floating gate in the logical area and the capacitance area is specifically as follows:

S0301: removing the silicon oxide layer on the upper surface of the cell area and on the upper surface of the floating gate in the logical area and the capacitance area by using a chemical mechanical polishing process;

S0302: removing the silicon nitride layer, which is not protected by the silicon oxide layer, on the upper surface of the cell area and on the upper surface of the floating gate in the logical area and the capacitance area by performing a wet etching on the Flash wafer.

Further, in the step S04, the step of adjusting the height of the silicon oxide filled shallow trench in the cell area and the capacitance area is specifically as follows:

S0401: performing a wet etching on the STI in the Flash wafer, to adjust the height of the silicon oxide filled shallow trench in the cell area. There is no change in the height of the silicon oxide filled shallow trench in the logical area and the capacitance area since there is the silicon nitride layer deposited on the surface thereof;

S0402: performing a dry etching on the silicon oxide filled shallow trench in the cell area and the capacitance area by using negative photoresist while a mask Z2 is used to protect the logical area, to achieve the adjustment on the silicon oxide filled shallow trench in the cell area and the capacitance area.

Further, in the step S0402, the height loss of the silicon oxide filled shallow trench in the capacitance area after being subjected to a fine adjustment is not more than 100 Angstrom.

Further, in the step 06, the interlayer dielectric layer, the silicon oxide, the silicon nitride, the floating gate and a part of the silicon oxide filled shallow trench in the logical area are removed by performing an etching with positive photoresist.

Further, the interlayer dielectric layer is a three-layer-structure consisting of silicon oxide-silicon nitride-silicon oxide layers.

Further, the width of the STI in the capacitance area is larger than the width of the STI in the cell area.

The beneficial effects of the present invention are as follows: the present invention, by using the silicon nitride layer and the silicon oxide layer as a protection layer, achieves the individual adjustment on the height of the silicon oxide filled shallow trench in the cell area, the capacitance area and the logical area in the Flash wafer; and by adopting the method of the present invention, it can achieve the adjustment on the height of the silicon oxide filled shallow trench in the capacitance area without adding new mask and changing the height of the silicon oxide filled shallow trench in the cell area and the logical area.

DETAILED DESCRIPTION OF THE EMBODIMENTS

To make the object, the technical solution and the advantage of the present invention clearer, the specific embodiments of the present invention are described in detail below in combination with drawings.

Figure 1:
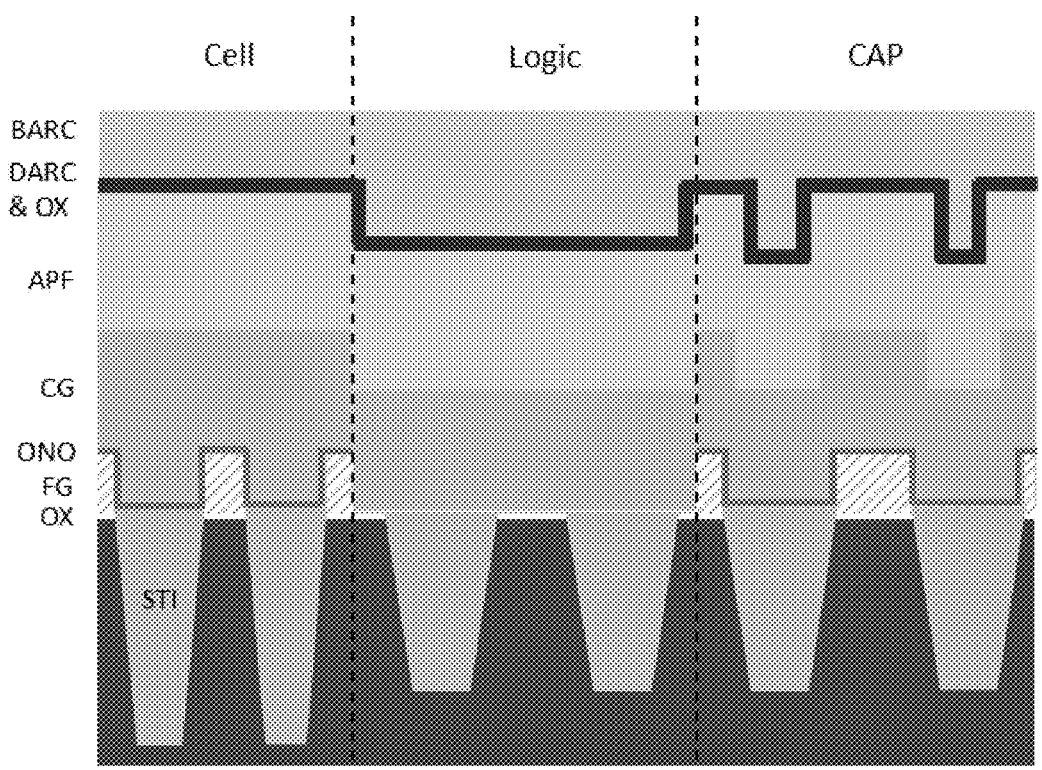
FIG. 1 is a Flash device containing a capacitance area in the prior art.
Figure 2:
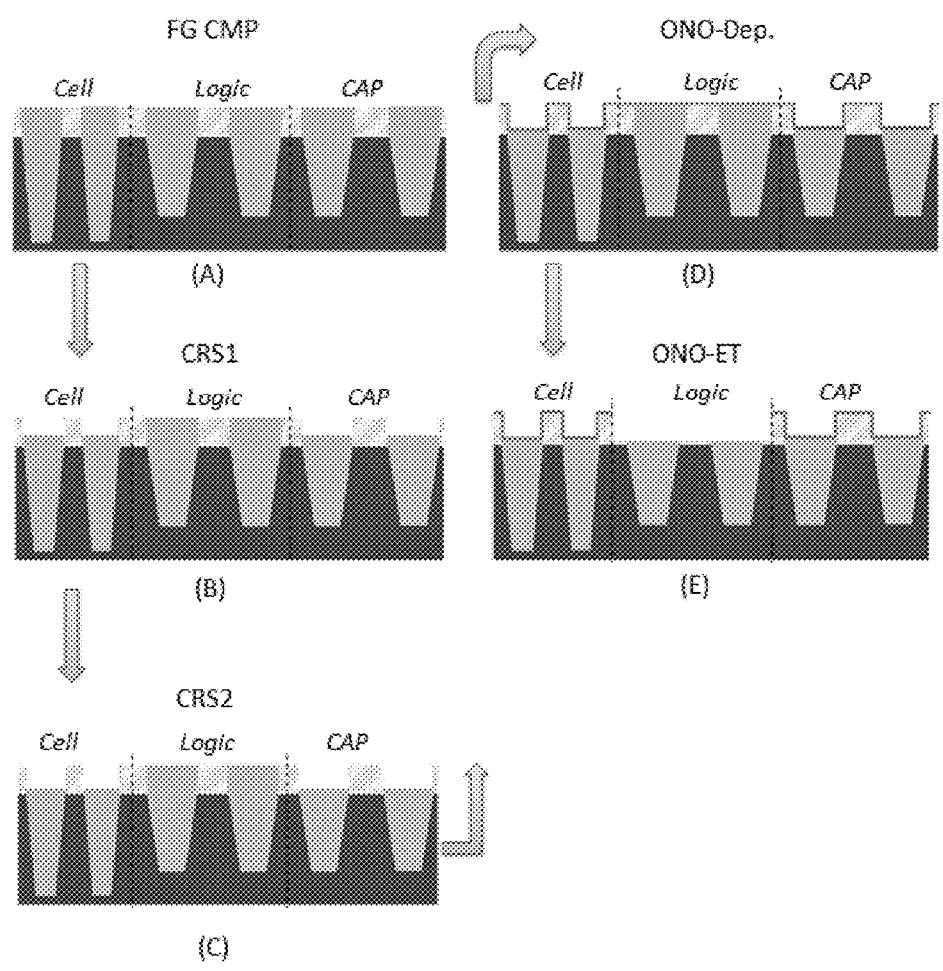
FIG. 2 is a diagram of a manufacturing process of increasing the height of a silicon oxide filled shallow trench in a capacitance area relative to an active area in the prior art.
Figure 3:
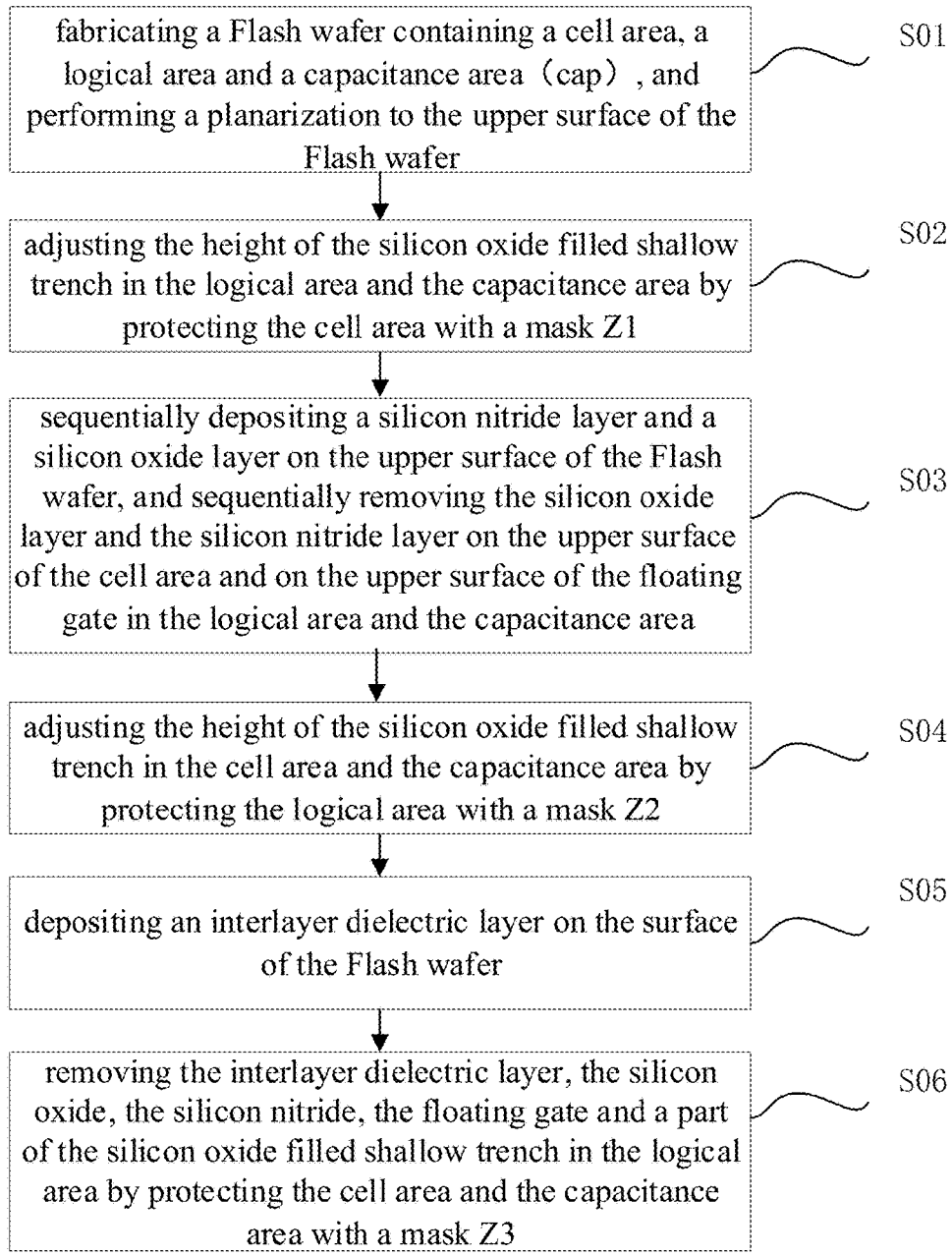
FIG. 3 is a flow chart of a manufacturing method of a Flash wafer in the present invention.
Figure 4:
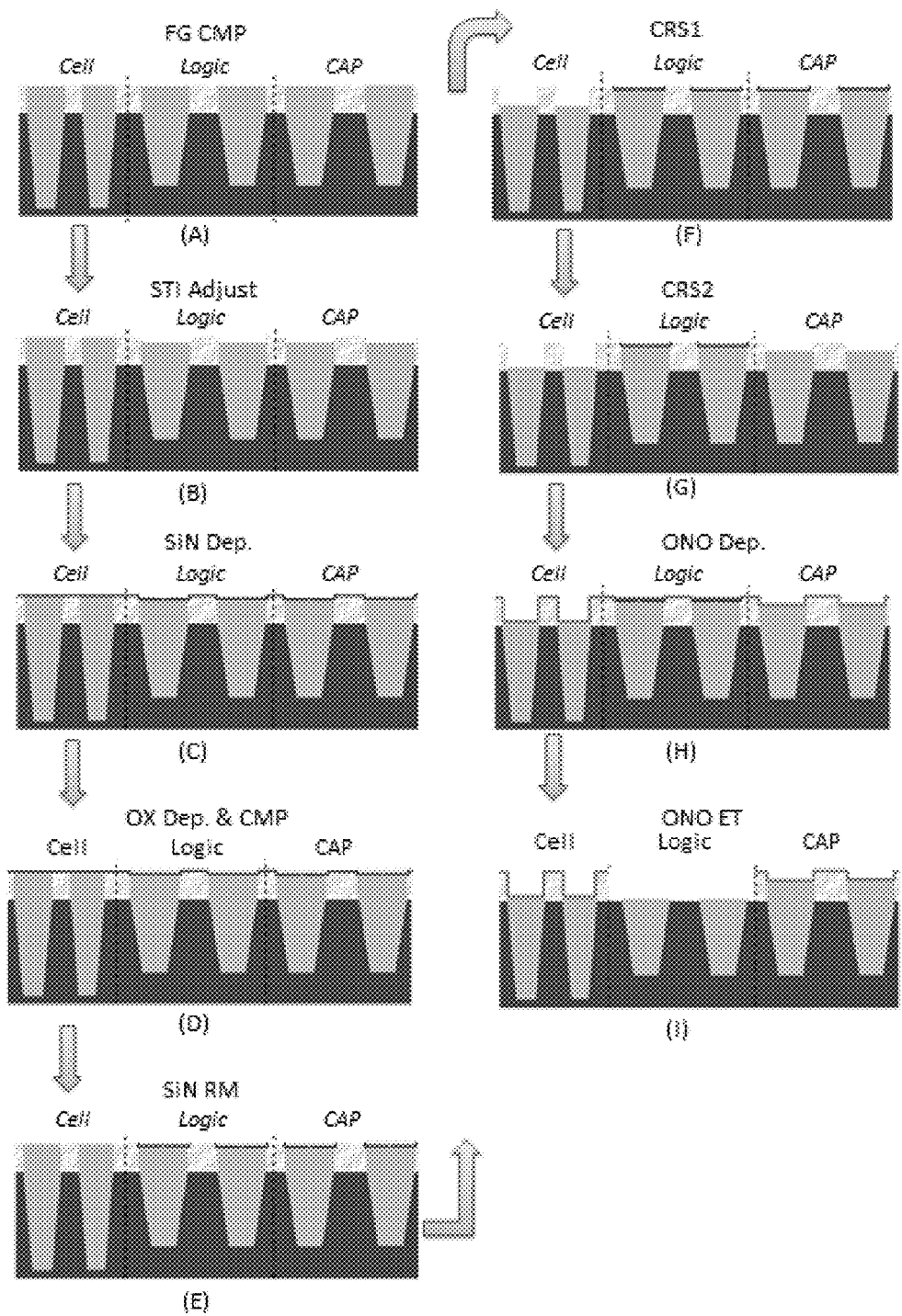
FIG. 4 is a diagram of a manufacturing process of the Flash wafer in the present invention.

As shown in FIG. 3 and FIG. 4, the present invention provides a manufacturing method of a Flash wafer, comprising the following steps of:

S01: as shown in FIG. 4A, fabricating a Flash wafer containing a cell area, a logical area and a capacitance area, and performing a planarization to the upper surface of the Flash wafer, wherein each of the cell area, the logical area and the capacitance area includes a STI and an active area, the STI is located in the gap of the active area, there is a floating gate above the active area, a silicon oxide filled shallow trench is contained in the STI, and the upper surfaces of the planarized silicon oxide filled shallow trench and the floating gate are located on the same plane.

Wherein, in the present embodiment, the width of the STI in the capacitance area is larger than that of the STI in the cell area in the Flash wafer. Other forms in the actual production can also be processed by applying the method of the present invention. The upper surface of the Flash wafer after being subjected to planarization is smooth, and in the cell area, the logical area and the capacitance area, the upper surface of the silicon oxide filled shallow trench and the upper surface of the floating gate both are located on the same horizontal plane, to be convenient for the subsequent process.

S02: as shown in FIG. 4B, adjusting the height of the silicon oxide filled shallow trench in the logical area and the capacitance area by protecting the cell area with a mask Z1, so that the height of the silicon oxide filled shallow trench in the logical area and the capacitance area is lower than that of the floating gate after adjusting.

Wherein, the mask in the present step is a mask on a production line in the prior art, and the STI in the logical area and the capacitance area may be etched by using positive photoresist. After the present step, the height of the silicon oxide filled shallow trench in the logical area and the capacitance area is lower than the height of the floating gate by 100 Angstrom. This step makes the height of the silicon oxide filled shallow trench in the logical area and the capacitance area slightly lower than that of the floating gate. This is mainly to deposit a silicon nitride layer and a silicon oxide layer in next step, and can remain the silicon nitride layer and the silicon oxide layer above the STI in the capacitance area and the logical area after planarization.

S03: removing the rest photoresist, and sequentially depositing a silicon nitride layer and a silicon oxide layer on the upper surface of the Flash wafer, and sequentially removing the silicon oxide layer and the silicon nitride layer on the upper surface of the cell area and on the upper surface of the floating gate in the logical area and the capacitance area.

Wherein, as shown in FIG. 4C, a silicon nitride layer is firstly deposited on the Flash wafer and then a silicon oxide layer is deposited. After the deposition, the step of removing the silicon nitride layer and the silicon oxide layer includes the following two steps:

S0301: as shown in FIG. 4D, the silicon oxide layer is removed by performing a chemical mechanical polishing on the Flash wafer. During the chemical mechanical polishing, the chemical mechanical polishing will not influence the STI in the logical area and the STI in the capacitance area, since the height of the floating gate in the cell area and the logical area is identical with that of the floating gate in the capacitance area, and is slightly higher than the height of the silicon oxide filled shallow trench in the logical area and the capacitance area. Therefore, after the chemical mechanical polishing, there is only silicon nitride layer on the upper surface of the cell area and the upper surface of the floating gate in the logical area and the capacitance area, and there are the silicon nitride layer and the silicon oxide layer on the upper surface of the silicon oxide filled shallow trench in the logical area and the capacitance area.

S0302: as shown in FIG. 4E, the silicon nitride layer, which is not protected by the silicon oxide layer, on the upper surface of the cell area and on the upper surface of the floating gate in the logical area and the capacitance area is removed by performing a wet etching on the Flash wafer. Wherein the wet etching solution has a high selectivity ratio relative to the silicon oxide and the polysilicon. In this step, since there is only silicon nitride layer on the upper surface of the cell area and on the upper surface of the floating gate in the logical area and the capacitance area, the silicon nitride thereon will be etched off during the wet etching. However, for the silicon nitride layer on the upper surface of the STI in the logical area and the capacitance area, since it can be protected by the rest silicon oxide, the silicon nitride layer and the silicon oxide layer thereon both are remained after the wet etching procedure.

S04: adjusting the height of the silicon oxide filled shallow trench in the cell area and the capacitance area by protecting the logical area with a mask Z2, so that the height of the silicon oxide filled shallow trench in the cell area is lower than that of the silicon oxide filled shallow trench in the capacitance area after adjusting.

Wherein, the step of adjusting the height of the silicon oxide filled shallow trench in the cell area and the capacitance area is specifically as follows:

S0401: as shown in FIG. 4F, performing a wet etching on the shallow trench area in the Flash wafer, to adjust the height of the silicon oxide filled shallow trench in the cell area. In this step, the wet etching solution has a high selectivity ratio relative to the polysilicon and the silicon nitride. The upper surface of the silicon oxide filled shallow trench in the capacitance area and the logical area is not influenced since there is the silicon nitride layer deposited thereon. Therefore, the wet etching in this step is mainly directed to the silicon oxide filled shallow trench in the cell area, to make the height thereof approach the height required for the subsequent process.

S0402: as shown in FIG. 4G; performing a dry etching on the silicon oxide filled shallow trench in the cell area and the capacitance area by using negative photoresist while a mask Z2 in the prior art is used to protect the logical area, to achieve a fine adjustment on the silicon oxide filled shallow trench in the cell area and the capacitance area. In this step, the logical area due to being protected by the mask is not influenced, and the STI of the cell area after being subjected to a fine adjustment on a basis of approaching the process height, attains the height required for the subsequent process; since there is the silicon nitride layer on the silicon oxide filled shallow trench in the capacitance area, this makes the loss thereof slight and not more than 100 Angstrom.

At this point, the height of the silicon oxide filled shallow trench in the capacitance area in the Flash wafer attains the requirement of the subsequent process, and the silicon oxide filled shallow trench in the capacitance area is basically close to the floating gate in height, thereby solving the problem in the prior art that the silicon oxide filled shallow trench in the cell area and the silicon oxide filled shallow trench in the capacitance area simultaneously change in the height.

S05: as shown in FIG. 4H, removing the rest photoresist and depositing an interlayer dielectric layer on the surface of the Flash wafer. Wherein, the interlayer dielectric layer is a three-layer-structure consisting of silicon oxide-silicon nitride-silicon oxide layers.

S06: as shown in FIG. 4I, removing the interlayer dielectric layer, the silicon oxide, the silicon nitride, the floating gate and a part of the silicon oxide filled shallow trench in the logical area by protecting the cell area and the capacitance area with a mask Z3, to obtain the cell area, the logical area and the capacitance area which are different in the height of the silicon oxide filled shallow trench. Specifically, in the removing step, the positive photoresist may be adopted to etch the rest portion in the logical area.

A Flash product can be obtained by processing the Flash wafer manufactured in the present invention according to the process of manufacturing the Flash product in the prior art.

It can be seen from the above processes, the quantity of the mask used in the present invention is same as the quantity of the mask in the prior art, so the present invention does not increase the extra production cost. In addition, the present invention achieves the height adjustment of the silicon oxide filled shallow trench in the capacitance area by performing different processing on the cell area, the logical area and the capacitance area without changing the height of the silicon oxide filled shallow trench in the cell area and the logical area.

Although the present invention has been disclosed as above with respect to the preferred embodiments, they should not be construed as limitations to the present invention. Various modifications and variations can be made by the ordinary skilled in the art without departing the spirit and scope of the present invention. Therefore, the protection scope of the present invention should be defined by the appended claims.

The invention claimed is:

1. A manufacturing method of a Flash wafer, comprising the following steps of:

S01: fabricating the Flash wafer containing a cell area, a logical area and a capacitance area, and performing a planarization to an upper surface of the Flash wafer, wherein each of the cell area, the logical area and the capacitance area includes a STI and an active area, the STI is located in a gap of the active area, there is a floating gate above the active area, a silicon oxide filled shallow trench is contained in the STI, and the upper surfaces of the planarized silicon oxide filled shallow trench and floating gate are located on the same plane;

S02: adjusting the height of the silicon oxide filled shallow trench in the logical area and the capacitance area by protecting the cell area with a first mask, so that the height of the silicon oxide filled shallow trench in the logical area and the capacitance area is lower than the height of the floating gate after adjusting;

S03: sequentially depositing a silicon nitride layer and a silicon oxide layer on the upper surface of the Flash wafer, and sequentially removing the silicon oxide layer and the silicon nitride layer on the upper surface of the cell area and on the upper surface of the floating gate in the logical area and the capacitance area;

S04: adjusting the height of the silicon oxide filled shallow trench in the cell area and the capacitance area by protecting the logical area with a second mask, so that the height of the silicon oxide filled shallow trench in the cell area is lower than the height of the silicon oxide filled shallow trench in the capacitance area after adjusting;

S05: depositing an interlayer dielectric layer on the surface of the Flash wafer;

S06: removing the interlayer dielectric layer, the silicon oxide, the silicon nitride, the floating gate and a part of the silicon oxide filled shallow trench in the logical area by protecting the cell area and the capacitance area with a third mask, to obtain the cell area, the logical area and the capacitance area which are different in the height of the silicon oxide filled shallow trench.

2. The manufacturing method of the Flash wafer according to claim 1, wherein, in the step S02, the method of adjusting the height of the silicon oxide filled shallow trench in the logical area and the capacitance area is to etch the silicon oxide filled shallow trench in the logical area and the capacitance area by using positive photoresist.

3. The manufacturing method of the Flash wafer according to claim 2, wherein the silicon oxide filled shallow trench in the logical area and the capacitance area after being etched by using the positive photoresist is lower than the floating gate by 100 Angstrom.

4. The manufacturing method of the Flash wafer according to claim 1, wherein, in the step S03, the step of removing the silicon oxide layer and the silicon nitride layer on the upper surface of the cell area and on the upper surface of the floating gate in the logical area and the capacitance area is specifically as follows:

S0301: removing the silicon oxide layer on the upper surface of the cell area and on the upper surface of the floating gate in the logical area and the capacitance area by using a chemical mechanical polishing process;

S0302: removing the silicon nitride layer, which is not protected by the silicon oxide layer, on the upper surface of the cell area and on the upper surface of the floating gate in the logical area and the capacitance area by performing a wet etching on the Flash wafer.

5. The manufacturing method of the Flash wafer according to claim 1, wherein in the step S04, the step of adjusting the height of the silicon oxide filled shallow trench in the cell area and the capacitance area is specifically as follows:

S0401: performing a wet etching on the STI in the Flash wafer, to adjust the height of the silicon oxide filled shallow trench in the cell area, wherein the STI in the capacitance area due to being protected by the silicon nitride layer is not influenced;

S0402: performing a dry etching on the STI in the cell area and the capacitance area by using negative photoresist while the second mask is used to protect the logical area, to achieve a further adjustment on the silicon oxide filled shallow trench in the cell area and the capacitance area.

6. The manufacturing method of the Flash wafer according to claim 5, wherein in the step S0402, the height loss of the silicon oxide filled shallow trench in the capacitance area after being subjected to a fine adjustment is not more than 100 Angstrom.

7. The manufacturing method of the Flash wafer according to claim 1, wherein in the step 06, the interlayer dielectric layer, the silicon oxide, the silicon nitride, the floating gate and a part of the silicon oxide filled shallow trench in the logical area are removed by performing an etching with positive photoresist.

8. The manufacturing method of the Flash wafer according to claim 1, wherein the interlayer dielectric layer is a three-layer-structure consisting of silicon oxide-silicon nitride-silicon oxide layers.

9. The manufacturing method of the Flash wafer according to claim 1, wherein the width of the STI in the capacitance area is larger than the width of the STI in the cell area.

* * * * *